United States Patent
Parrish et al.

(10) Patent No.: US 6,950,770 B2
(45) Date of Patent: Sep. 27, 2005

(54) METHOD AND APPARATUS FOR CALIBRATION OF A DELAY ELEMENT

(75) Inventors: Gregory C. Parrish, Folsom, CA (US); Subrata Mandal, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/255,871

(22) Filed: Sep. 25, 2002

(65) Prior Publication Data

US 2004/0059533 A1 Mar. 25, 2004

(51) Int. Cl.[7] .................................................. G11C 7/00
(52) U.S. Cl. ..................... 702/107; 702/65; 702/106; 365/194; 365/230.03
(58) Field of Search ............................. 365/194, 230.03; 702/65, 72, 106, 107, 89; 324/601, 622, 76.77, 76.79, 76.82, 76.54, 86, 107; 327/149, 150, 158, 159, 161, 162, 270, 276, 392, 393, 277, 261; 361/78, 85; 307/127, 14; 340/316.04; 375/355, 371

(56) References Cited

U.S. PATENT DOCUMENTS

| | | | | |
|---|---|---|---|---|
| 5,049,766 A | * | 9/1991 | van Driest et al. .......... 327/269 |
| 5,463,337 A | * | 10/1995 | Leonowich ................. 327/158 |
| 5,663,991 A | * | 9/1997 | Kelkar et al. ............... 375/376 |
| 5,789,969 A | * | 8/1998 | Davis et al. ................ 327/276 |
| 6,044,122 A | * | 3/2000 | Ellersick et al. ............ 375/360 |
| 6,105,157 A | * | 8/2000 | Miller ........................ 714/744 |
| 6,225,843 B1 | * | 5/2001 | Taniguchi et al. .......... 327/158 |
| 6,232,806 B1 | * | 5/2001 | Woeste et al. .............. 327/149 |
| 6,236,695 B1 | * | 5/2001 | Taylor ........................ 375/372 |
| 6,292,507 B1 | * | 9/2001 | Hardin et al. ............... 375/130 |
| 6,369,627 B1 | * | 4/2002 | Tomita ....................... 327/158 |
| 6,622,103 B1 | * | 9/2003 | Miller ......................... 702/89 |
| 6,639,413 B2 | * | 10/2003 | Whitehead et al. ......... 324/601 |
| 6,750,688 B2 | * | 6/2004 | Takai .......................... 327/158 |
| 2001/0011914 A1 | * | 8/2001 | Pomet ........................ 327/165 |
| 2003/0039159 A1 | * | 2/2003 | Ware et al. ................. 365/200 |
| 2003/0227308 A1 | * | 12/2003 | Cooper ....................... 327/158 |

* cited by examiner

*Primary Examiner*—Carol S. W. Tsai
(74) *Attorney, Agent, or Firm*—Blakely, Sokoloff, Taylor & Zafman LLP

(57) ABSTRACT

Various methods, systems and apparatuses having an integrated circuit that contains a calibration circuit having a series of delay elements to receive a reference signal. The reference signal establishes a standard unit of time. The calibration circuit also generates one or more calibrated delay signals derived from the reference signal. The one or more calibrated delay signals are precise to a known fraction of the standard unit of time.

21 Claims, 4 Drawing Sheets

US 6,950,770 B2

METHOD AND APPARATUS FOR CALIBRATION OF A DELAY ELEMENT

FIELD OF THE INVENTION

Embodiments of the invention generally relate to timing mechanisms within an integrated circuit. More particularly, an aspect of an embodiment of the invention relates to making a calibrated timing mechanism within an integrated circuit.

BACKGROUND OF THE INVENTION

Typically, timing measurements can be performed by either using an internal device such as a delay cell, or using an external device such as a tester. Measurements using an internal device are usually performed by relative comparison. How long did an unknown delay time take relative to a potentially imprecise known delay. One of the problems occurs with the calibration of the "known" delay element to a precise value. Delay cells are generally limited in the accuracy of their measurements. The accuracy of a delay cell's performance can change with variations in the silicon manufacturing process, variations in operating voltage, and variations in operating temperature (PVT) of the delay cells. Likewise, the accuracy of the calibration of the delay cell can degrade the further the separation in time from when a delay is calibrated and when that same delay cell is used in making a time measurement.

Some prior art devices may become inaccurate unless complex methods to compensate for PVT are used. These methods may use searching algorithms for the calibration cycle, where a pulse is presented to the delay element and an external measuring device will "search" for the output transition edge. This requires significant time. Some internal calibration designs may choose to use digital delay lines (DLL's). However, DLL's usually occupy a significant amount of silicon area in an integrated circuit.

Measurements entirely through an external tester are subject to greater inaccuracies due to "edge placement uncertainty". Further, the length of the cables may add an imprecise parameter into the measurement.

BRIEF DESCRIPTION OF THE DRAWINGS

The drawings refer to embodiments of the invention in which.

Figure 1:
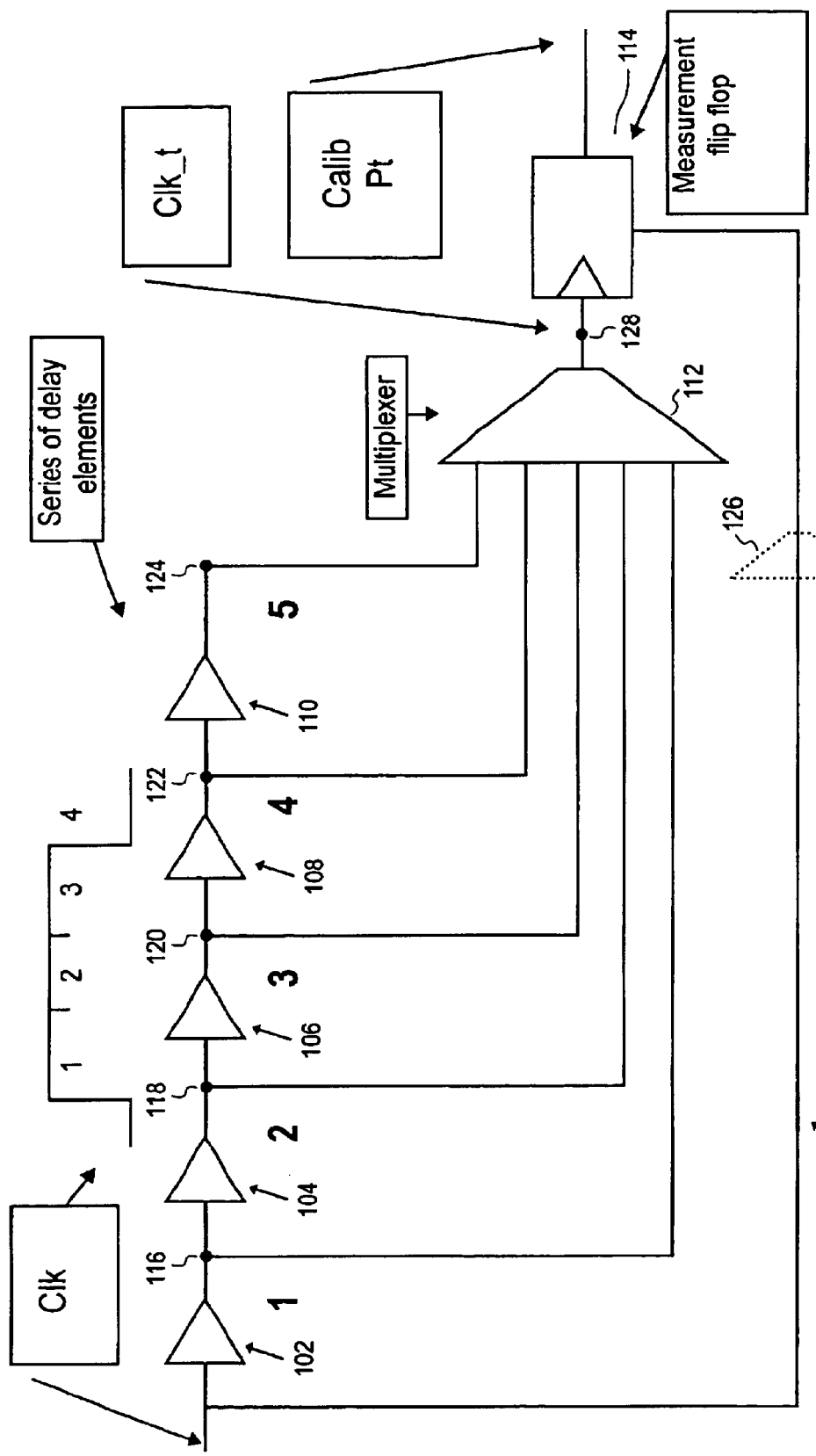
FIG. 1 is block diagram of an embodiment of a calibration circuit having a series of delay elements to receive a reference signal and to generate calibrated delay signals derived from the reference signal.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific number of delay elements, named component blocks, types of circuit diagrams, etc., in order to provide a thorough understanding of the present invention. It will be apparent, however, to one skilled in the art that the present invention may be practiced without these specific details. In other instances, well known components or methods have not been described in detail but rather in a block diagram in order to avoid unnecessarily obscuring the present invention. Thus, the specific details set forth are merely example. The specific details may be varied from and still be contemplated to be within the spirit and scope of the present invention. The term coupled is defined as meaning connected either directly or indirectly through another component.

In general, a method, apparatus and system are described that have an integrated circuit that contains a calibration circuit having a series of delay elements to receive a reference signal. The reference signal establishes a standard unit of time. The calibration circuit also generates one or more calibrated delay signals derived from the reference signal. The one or more calibrated delay signals are precise to a known fraction of the standard unit of time.

FIG. 1 is a block diagram of an embodiment of a calibration circuit having a series of delay elements to receive a reference signal and to generate calibrated delay signals derived from the reference signal. In an embodiment, the calibration circuit 100 may contain a series of delay elements, such as a first delay element 102 through a fifth delay element 110, a first multiplexer 112, and a sampling device such as a measurement flip-flop 114. The calibration circuit 100 may be contained within an integrated circuit, such as a processor or chip set.

The first delay element 102 and the measurement flip-flop 114 receive the reference signal, such as a clock pulse. The reference signal establishes a standard unit of time in the calibration circuit 100. The reference signal may be a clock with a known, substantially-repeatable pulse period such as a crystal oscillator with a frequency of one gigahertz. The standard unit of time may be, for example, one pulse, five pulses, or even five and half cycles but the calibration signal and the circuit being measured relate to the same standard unit of time derived from the reference signal. Hereinafter the standard unit of time will be one clock pulse for ease of conveying that concept.

In this example, all of the delay elements 102–110 have substantially an equal delay time. In another embodiment, the delay elements 102–110 may have unequal delay times but are fixed, repeatable, and have the same time delay relationship with respect to each other. One way of achieving delay elements 102–110 having equal time delays is to fabricate each delay element as a matched pair of transistors, identical buffer structures, or similar matched components, on the silicon wafer in close proximity to all of the other delay elements in the series of delay elements. In this example, the five delay elements 102–110 generate five equal delay signals derived from the reference signal and delayed from that reference signal by a known fraction of the standard unit of time. Monitor points exist at the outputs 116–124 of each of the five delay elements to an input of the first multiplexer 112.

The first multiplexer 112 passes the output signals of the delay elements to the measurement flip-flop 114 to establish a calibrated measurement of time based upon the standard unit of time. The first multiplexer 112 is sequenced to pass the output signals of the various delay elements to the measurement flip-flop 114. When the sum of the delays from the output of the first multiplexer 112 is equal to one period of the clock, then the output of the measurement flip-flop 114 transitions.

The calibrated time delay value of a single delay element can be calculated by knowing the pulse period of the reference signal and the number of delay elements 102–110 from the input delay element 102 to the monitor point 116–124 that transitions the measurement flip-flop 114.

For example, if the period of the clock pulse is 1 nanosecond (1/one gigahertz) and the delay signal appears on the output 120 of the third delay element 106 just prior to the transition of the measurement flip-flop 114, then the output signal of the each delay element lags the clock pulse of the reference signal by increments of approximately 0.33 nanoseconds (one third the time value of the clock pulse). Any of the output signals of the delay elements 102–110 may be used as calibrated delay signals precise to a known fraction of the period associated with one clock pulse.

Knowing the time delay value of each delay element 102–110 provides important information with regard to various internal test measurements inside the chip. This information allows the calibration circuit 100 to make calibrated time measurements precise to fractions of the period of the reference clock.

Figure 2:
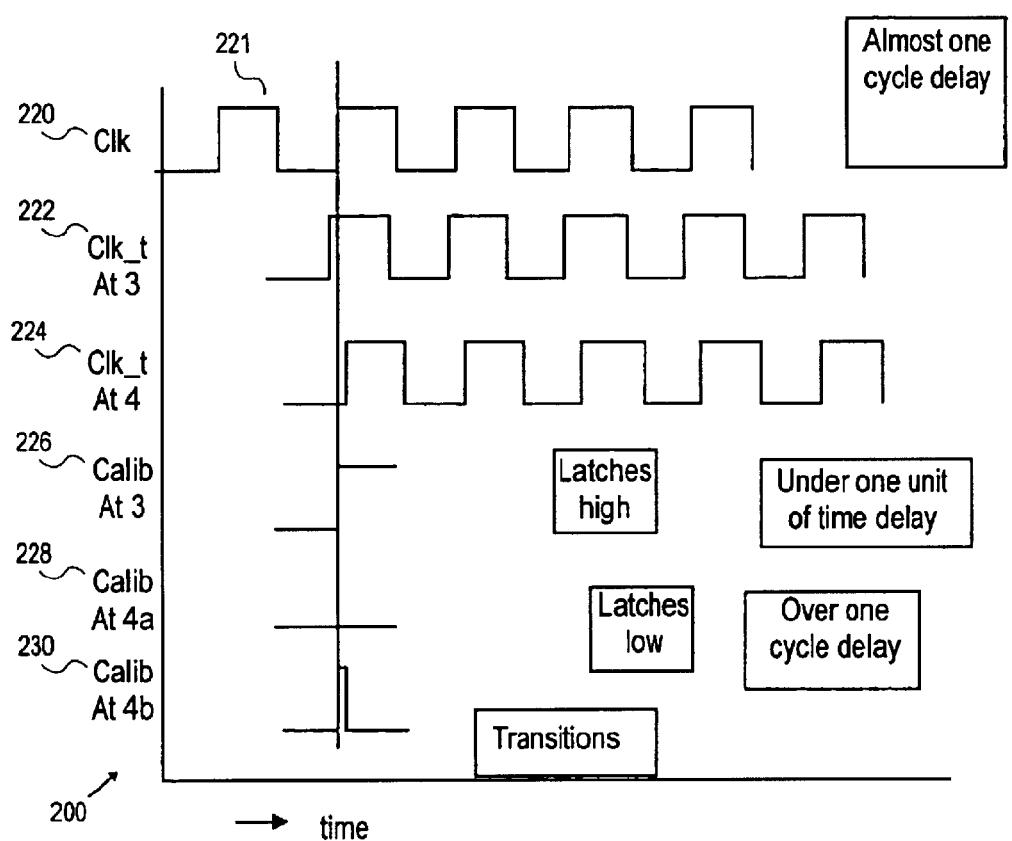
FIG. 2 illustrates a timing diagram of the calibration circuit illustrated in FIG. 1.

FIG. 2 illustrates a timing diagram of the calibration circuit 100 illustrated in FIG. 1. The timing diagram 200 illustrates the reference signal (Clk) 220 received by the initial delay element and the measurement flip-flop, the delay signal at the output of the third delay element 222 (Clk_T at 3), the delay signal at the output of the fourth delay element 224 (Clk_T at 4), the output signal of the measurement flip-flop when the delay signal from the third delay element is on its input 226 (Calib at 3), and the output signal of the measurement flip-flop at the moment when the delay signal from the fourth delay element is on its input 228 (Calib at 4a).

In this example, the output signal of the fourth delay element 224 lags the reference signal 220 by over one standard unit of time. Thus, the output signal of the fourth delay unit 224 lags each clock pulse of the reference signal 220 by over one clock pulse. Therefore, the output signal of the measurement flip-flop 228 latches to a low state to indicate that the output signal of the fourth delay element lags the reference pulse by over one clock pulse.

The output signal of the third delay element 222 lags the reference signal 220 by less than one clock pulse. Therefore, the output signal of the measurement flip-flop when the delay signal from the third delay element is on its input 226 latches to a high state to indicate that the output signal of the third delay element lags the reference pulse by less one standard unit of time.

In another embodiment, the output of the measurement flip-flop 230, rather than latching to a specific state, may transition from high to low or low to high state in order to indicate the moment in time when the output signal of the very first delay element in the series of delay elements exceeds the period of one standard time unit.

A comparator, data lookup table, or some other similar device may be used to decode the output of the measurement flip-flop in order to determine how many delay elements are propagated through in one standard unit of time. The output signal of the measurement flip-flop communicates when the delay signal is just under and just over a single standard unit of time. When the measurement flip-flop transitions, the calibrated delay of a single element can be calculated by knowing the period of the reference signal and the number of delay elements from the input delay element to the monitor point that transitions the measurement flip-flop.

As described in the example above, the standard unit of time of the reference signal is one clock pulse having a period of approximately 1 nanoseconds. Thus, if the known period of the clock is 1 nanoseconds (1/one gigahertz) and the output signal of the third delay element occurs just prior to the transition of the measurement flip-flop, then the output signal of the second delay element lags the clock pulse of the reference signal by approximately 0.66 nanoseconds (two thirds the time value of the clock pulse). Further, in this example, the output of the fifth delay element is approximately 1.66 nanoseconds (five times 0.33 nanoseconds).

In this example, a timing measurement referenced against the calibrated delayed clock signal (Clk_T) will be three times more precise than that the same measurement of an unknown timing event being only referenced against the reference signal. The precision of a measurement based upon the reference signal by itself is in 1 nanosecond increments of time, i.e. between 0 and 1 nanoseconds. The actual point in time when an exemplary edge of a measured signal falls may occur, for example, at 0.1 nanoseconds or at 0.9 nanoseconds. The only thing known for sure is that the edge of the measured signal fell sometime during that 1 nanosecond period of time. The precision of a measurement based upon the calibrated delay clock signals is in ⅓ of a nanosecond increments, i.e. between 0 and 0.33, 0.33 to 0.66, etc. Thus, the measurement of an unknown time interval becomes more precise as the smaller the elapse of time between known reference timing signals. Now, a time measurement of the edge of the signal falling at an actual time of 0.1 nanoseconds may occur with the precision knowing that that event occurred between 0.0 nanoseconds and 0.33 nanoseconds. Similarly, if the edge of the signal falls at an actual time of 0.9 nanoseconds, then the precision of when that event occurred may be known to occur during the time period of 0.67 nanoseconds and 1.0 nanoseconds.

Referring to FIG. 1, a connection exists at point Clk_T 128 to communicate the output of each delay element. The output of each delay element being a delay signal precise to within the known fraction of the standard unit of time and derived from the reference signal.

In an embodiment, forty or more delay elements may connect to form the series of delay elements. Further, even if a standard unit of time is one clock pulse, the time delay associated with each delay element may be derived from, for example, three clock pulses. Thus, if the delay signal appears on the output of a tenth delay element just prior to the third transition of the measurement flip-flop, then, in this example, the output of the first delay element lags the reference signal by approximately 3 nanoseconds (30 nanoseconds/10). Similarly, the delay signal generated by the second delay element lags the reference pulse by two thirds of a standard unit of time, 6 nanoseconds.

In an embodiment, a second multiplexer 126 matched to the first multiplexer 112 couples the reference signal to the input of the measurement flip-flop 114. The second multiplexer 126 mathematically cancels undesired periods of delay induced by the first multiplexer 112 when calculating the delay time associated with each delay element 102–110.

The output of any given delay element lags the clock pulse of the reference signal by a known time value that is a fraction of the clock pulse. The process generates precisely calibrated delay signals relative to the reference signal.

Moreover, the calibration circuit 100 has a given accuracy. The accuracy of the calibration circuit 100 is independent of the silicon process used to make the calibration circuit 100, operating voltage applied to the calibration circuit 100 or operating temperature that the calibration circuit 100 is exposed to. In an embodiment, the silicon material used to create the delay elements is the same material used to create the other components on the integrated chip. The calibration circuit 100 is exposed to the same operating temperature and operating voltages as the other components on the integrated chip. Generation of the calibrated signal and measurement with that calibrated signal are made roughly at the same time and thus exposed to roughly the same operating conditions.

Figure 3:
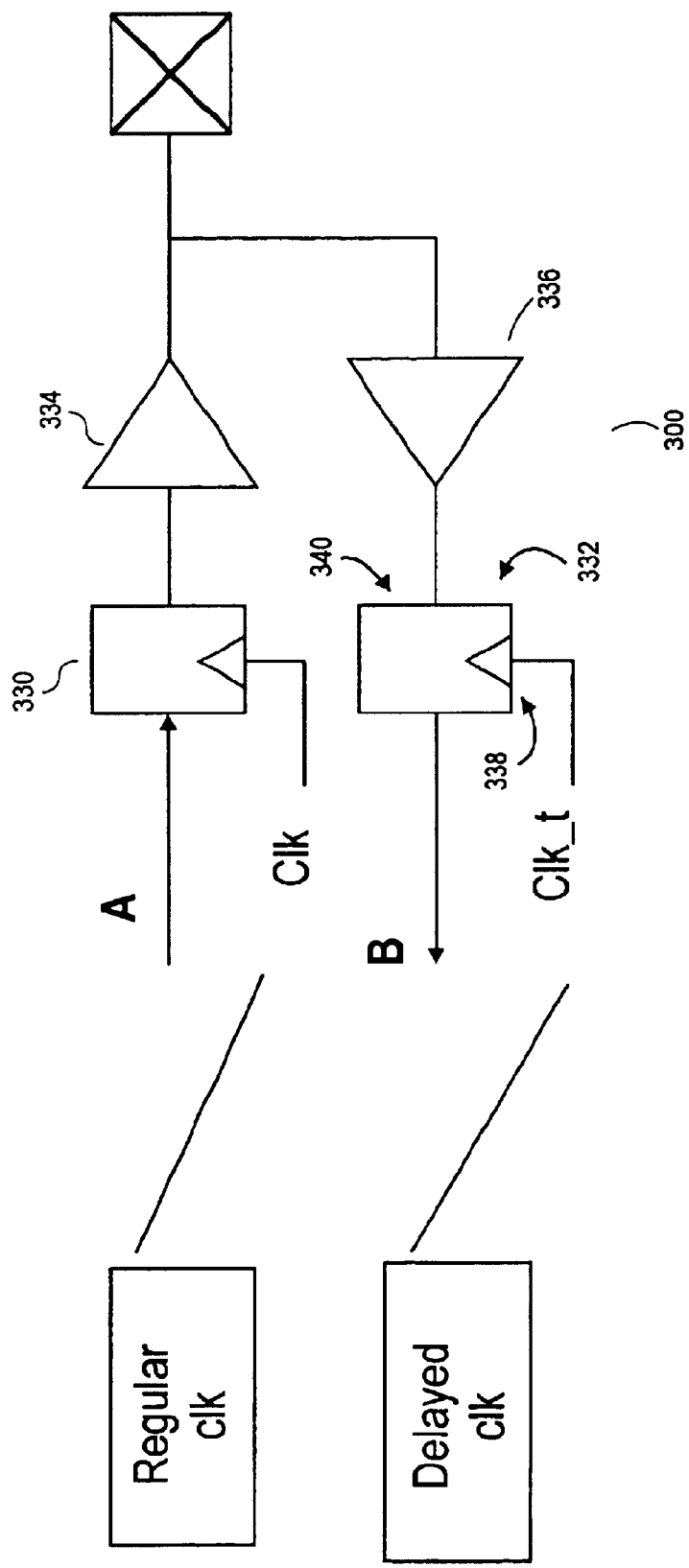
FIG. 3 illustrates a timing measurement made on a circuit at approximately the same time that the calibration of the delay signal occurs.

FIG. 3 illustrates a timing measurement made on a circuit at approximately the same time that the calibration of the delay signal occurs. The example circuit illustrated in FIG. 3 is an input-output buffer 300. The example input-output buffer 300 may have a first sampling device 330, a second sampling device 332, an out driver 334, and an in driver 336. The first sampling device 330 receives the reference signal. The second sampling device 332 receives the calibrated delay signal.

A test of the quality of this input-output buffer circuit 300 may be whether a data signal received at the A input of the first sampling device 330 propagates to the B output of the second sampling device 332 within N number of nanoseconds. N may be any number of nanoseconds such as 6 and ⅔ nanoseconds. The reference signal (Clk) goes to the initial delay element in the series of delay elements, the measurement flip-flop, and the clock input of the first sampling device. The data signal passes through the A input of the first sampling device 330, the out driver 334, and the in driver 336 to the second sampling device 332.

In an embodiment, the process of generating a calibrated delay signal and making timing measurements referenced against those calibrated delay signals may be a one step process where both occur in approximately the same moment. In an embodiment, the process of generating a calibrated delay signal and making timing measurements referenced against those calibrated delay signals may be a two step process where the actual timing measurement occurs within a couple clock cycles of the calibration clock pulse. In both cases, the process of generating a calibrated delay signal and making timing measurements referenced against those calibrated delay signals occurs at approximately the same time.

The second sampling device 332 may selectively receive a particular delay signal approximately at the moment in time in which that delay signal is being generated. In an embodiment, the output of the second delay element is coupled through a third multiplexer to the delay clock input 338 of the second sampling device 332. If the data signal reaches the input 340 of the second sampling device 332 prior to the delay signal appearing on the output of the third delay device, then the second sampling device 332 senses a high voltage on its delay clock input 338 and passes the data signal to point B. If not, the delay clock input 338 senses a low voltage and the data signal does not pass to point B. External test points or indicators may be used to communicate whether the input-output buffer circuit 300 passes its time measurement quality check.

Also note, that the state of the assertion voltage being high or low may be reversed or modified in some other way to communicate the state of a signal present on the output of a given delay element to a component making a timing measurement referenced against the calibrated delay signal from that delay element.

Alternatively, the second sampling device 332 may selectively receive a particular delay signal within a couple pulses of when the calculation of the calibrated delay time associated with that delay element is made.

In an embodiment, the calibration circuit may employ a feedback loop to the first multiplexer to selectively pass the outputs of the desired delay elements to the sampling device making the time measurement. Thus, the first standard unit of time, i.e. first clock pulse, determines the known fraction of the standard unit of time associated with each delay element. The results of that calculation determine the delay signals of the delay elements to be sent to the sampling component making a timing measurement. The feedback loop transmits a feedback signal to the first multiplexer to selectively pass only the output signals of the desired delay elements to the sampling component on a later clock pulse.

On the later clock pulse, the first sampling device 330 receives the reference signal to pass the data signal. The delayed clock input 338 of the second sampling device 332 receives the calibrated delay signals selected by the first multiplexer. In this example where the quality check is less than 6 and ⅔ nanoseconds, the first multiplexer only passes the delay signals from the first and second delay elements to the second sampling device 332 when the later clock pulse occurs.

In an embodiment, the calibration circuit may also use the calibrated delay signals for other functions than as reference measurements. The calibrated delay signals are precise and accurate to within a known fraction of the standard unit of time. Therefore, multiple waves of data from different data streams can be multiplexed into a single standard of unit time.

For example, a delay element chain may have eleven delay elements that are propagated though in one standard unit of time. Data from a first data stream transmits, for example, in the time frame between the delay signals from the initial delay element to the third delay element. The multiplexer on the receiving end receives the delay signals from the initial delay element to the third delay element. The delay signals are compensated for any time disparities between the transmit point and the receive point. Data from a second data stream transmits, for example, in the time frame between the delay signals from the fourth delay element to the sixth delay element. The multiplexer on the receiving end receives the delay signals from the fourth delay element to the sixth delay element. Data from a third data stream transmits, for example, in the time frame between the delay signals from the eighth delay element to the tenth delay element. The multiplexer on the receiving end receives the delay signals from the eighth delay element to the tenth delay element. Thus, the data from multiple data streams may be operated upon within one standard unit of time.

Figure 4:
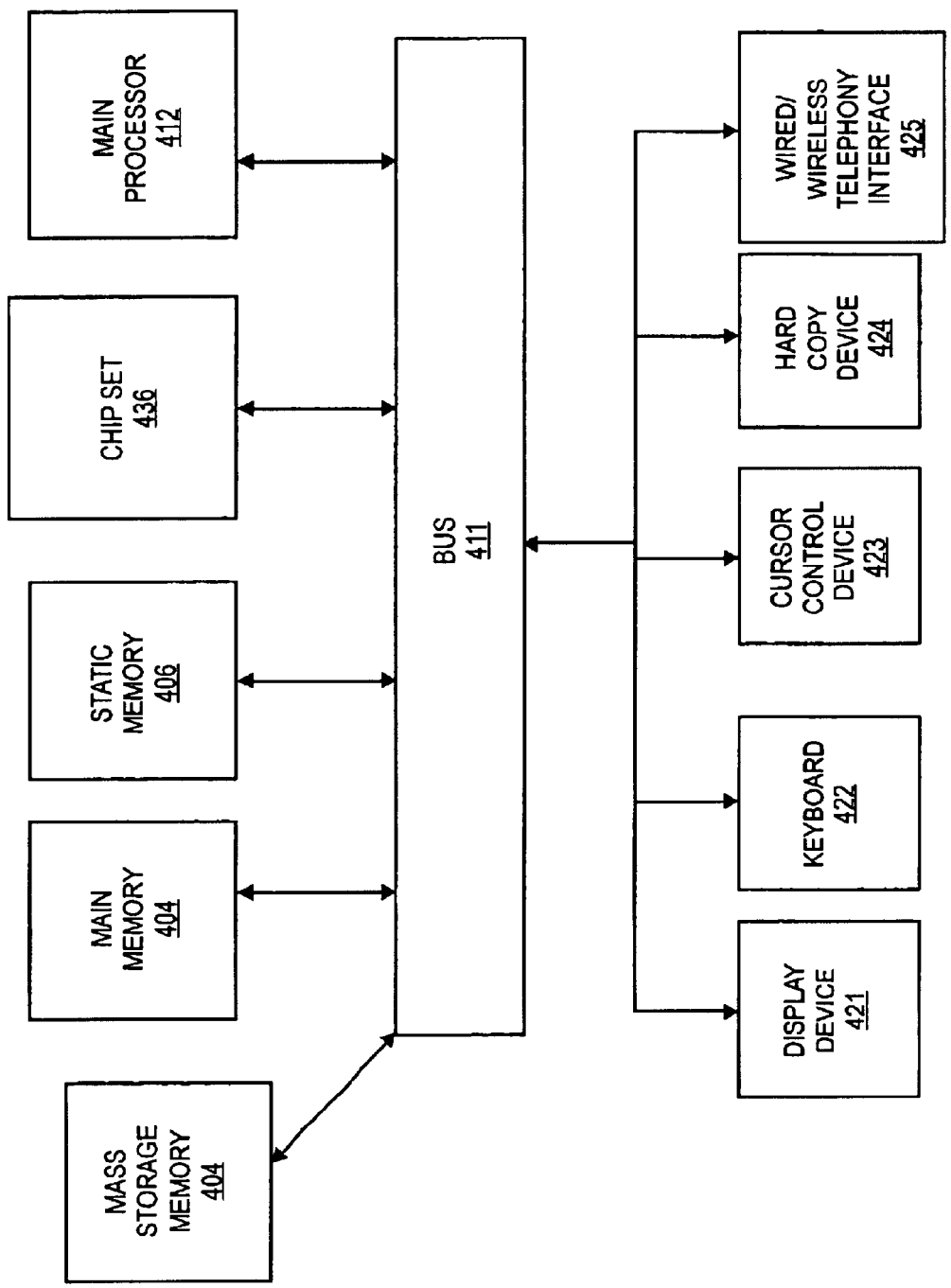
FIG. 4 illustrates a block diagram of an example computer system that may use the calibration circuit having a series of delay elements to receive a reference signal and to generate calibrated delay signals derived from the reference signal.

FIG. 4 illustrates a block diagram of an example computer system that may use the calibration circuit having a series of delay elements to receive a reference signal and to generate calibrated delay signals derived from the reference signal. In one embodiment, computer system 400 comprises a communication mechanism such as bus 411 for communicating information and a processor 412 coupled with bus 411 for processing information. One or more of the integrated circuit components in the computer system 400 such as the processor 412 or a chip set 436 may use an embodiment of the calibration circuit.

Computer system 400 further comprises a random access memory (RAM), or other dynamic storage device 404 (referred to as main memory) coupled to bus 411 for storing information and instructions to be executed by processor 412. Main memory 404 also may be used for storing temporary variables or other intermediate information during execution of instructions by processor 412. In an embodiment, the processor 412 may include a microprocessor, but is not limited to a microprocessor.

Computer system 400 also comprises a read only memory (ROM) and/or other static storage device 406 coupled to bus 411 for storing static information and instructions for processor 412, and a mass storage memory 404, such as a magnetic disk or optical disk and its corresponding disk drive. Mass storage memory 404 is coupled to bus 411 for storing information and instructions. In an embodiment, any of the memory components may also use the calibration circuit.

Computer system 400 may further be coupled to a display device 421, such as a cathode ray tube (CRT) or liquid crystal display (LCD), coupled to bus 411 for displaying information to a computer user. An alphanumeric input device (keyboard) 422, including alphanumeric and other keys, may also be coupled to bus 411 for communicating information and command selections to processor 412. An additional user input device is cursor control device 423, such as a mouse, trackball, trackpad, stylus, or cursor direction keys, coupled to bus 411 for communicating direction information and command selections to processor 412, and for controlling cursor movement on a display device 412.

Another device that may be coupled to bus 411 is a hard copy device 424, which may be used for printing instructions, data, or other information on a medium such as paper, film, or similar types of media. Furthermore, a sound recording and playback device, such as a speaker and/or microphone (not shown) may optionally be coupled to bus 411 for audio interfacing with computer system 400. Another device that may be coupled to bus 411 is a wired/wireless communication capability 425 to communication to a phone.

While some specific embodiments of the invention have been shown the invention is not to be limited to these embodiments. In an embodiment, the measurement flip-flop may be another form of sampling device. For example, most functions performed by electronic hardware components may be duplicated by software emulation. The invention is to be understood as not limited by the specific embodiments described herein, but only by scope of the appended claims.

We claim:

1. An integrated circuit, comprising:
a calibration circuit contained within the integrated circuit and having a series of delay elements to receive a reference signal, the reference signal is operable to establish a standard unit of time, wherein the calibration circuit also is operable to generate one or more calibrated delay signals derived from the reference signal and precise to a known fraction of the standard unit of time, and to calculate the known fraction of the standard unit of time according to an inverse of a number of the calibrated delay signals occurring within the standard unit of time established by the reference signal.

2. The integrated circuit of claim 1, wherein the calibration circuit further comprises:

a sampling device; and
a multiplexer coupled to the sampling device, the multiplexer to selectively pass one or more of the calibrated delay signals to the sampling device to make a calibrated measurement of time referenced against at least one of the delay signals.

3. The integrated circuit of claim 2, wherein the calibrated measurement of time and the generation of the at least one calibrated delay signal occur at approximately at the same time.

4. The integrated circuit of claim 1, further comprising:
a sampling device coupled to receive an output signal from one of the delay elements in the series of delay elements as well as the reference signal.

5. The integrated circuit of claim 4, wherein the sampling device receives the calibrated delay signal from one of the delay elements in the series of delay elements through a multiplexer.

6. The integrated circuit of claim 1, wherein the calibration circuit to also generate a signal precise to within a known fraction of the standard unit of time and derived from the reference signal.

7. The integrated circuit of claim 1, wherein the series of delay elements includes a first delay element and a second delay element, the first delay element comprises a first matched pair of transistors and the second delay element comprises a second matched pair of transistors.

8. The integrated circuit of claim 1, wherein the series of delay elements includes a first delay element and a second delay element, the first delay element comprises a first buffer, the second delay element comprises a second buffer, and the standard unit of time comprises one or more clock pulses.

9. The integrated circuit of claim 1, wherein the calibration circuit has a given accuracy that is independent of the silicon process used to make the calibration circuit, operating voltage applied to the calibration circuit, or operating temperature to which the calibration circuit is exposed.

10. A computing system, comprising:
a clock circuit to generate a reference signal; and
an integrated circuit that contains a calibration circuit having a series of delay elements coupled to receive the reference signal, the reference signal is operable to establish a standard unit of time, wherein the calibration circuit also is operable to generate one or more calibrated delay signals derived from the reference signal and precise to a known fraction of the standard unit of time, and to calculate the known fraction of the standard unit of time according to an inverse of a number of the calibrated delay signals occurring within the standard unit of time established by the reference signal.

11. The computing system of claim 10, wherein the integrated circuit comprises a processor.

12. The computing system of claim 10, wherein the integrated circuit comprises a chip set.

13. The computing system of claim 10, further comprising:
a sampling device; and
a multiplexer coupled to the sampling device, the multiplexer to selectively pass one or more of the calibrated delay signals to the sampling device to make a calibrated measurement of time referenced against at least one of the delay signals.

14. The computing system of claim 13, wherein the calibrated measurement of time and the generation of the at least one calibrated delay signal occur at approximately at the same time.

15. The computing system of claim 10, wherein the calibration circuit is operable to also generate a signal precise to within a known fraction of the standard unit of time and derived from the reference signal.

16. The computing system of claim 10, wherein each of the delay elements have substantially an equal delay time.

17. The computing system of claim 10, wherein each of the delay elements have unequal delay times but are fixed, repeatable, and have the same time delay relationship with respect to each other.

18. A method, comprising:

receiving a reference signal to establish a standard unit of time;

generating a calibrated delay signal that is derived from the reference signal and that is also delayed from the reference signal by a known time value that is a fraction of the standard unit of time; and making a timing measurement referenced against the calibrated delay signal by calculating the known time value according to an inverse of a number of the calibrated delay signals occurring within the standard unit of time established by the reference signal.

19. The method of claim 18, further comprising:

making the timing measurement and generating the calibrated delay signal at approximately the same time.

20. The method of claim 18, further comprising:

determining a delay time of a single delay element by dividing the standard unit of time by the number of delay elements propagated thorough in one standard unit of time.

21. The method of claim 20, further comprising:

generating the known time value associated with the calibrated delay signal by combining the delay times of one or more delay elements.

* * * * *